United States Patent
Aggarwal et al.

[11] Patent Number: 6,042,324
[45] Date of Patent: Mar. 28, 2000

[54] MULTI-STAGE SINGLE-DRIVE FOUP DOOR SYSTEM

[75] Inventors: Ravinder Aggarwal, Gilbert; Ronald R. Stevens, Scottsdale, both of Ariz.

[73] Assignee: ASM America, Inc., Phoenix, Ariz.

[21] Appl. No.: 09/277,662

[22] Filed: Mar. 26, 1999

[51] Int. Cl.⁷ .......................... B65G 49/07; B65G 47/06; H01L 21/68

[52] U.S. Cl. .......................... 414/411; 414/416; 414/217; 414/937; 414/939; 414/811

[58] Field of Search ..................... 414/811, 411, 414/416, 217, 935, 937, 938, 939, 940

[56] References Cited

U.S. PATENT DOCUMENTS

| | | |
|---|---|---|
| 4,775,281 | 10/1988 | Prentakis .................................. 414/416 |
| 5,186,594 | 2/1993 | Toshima et al. . |
| 5,378,107 | 1/1995 | Vierny et al. . |
| 5,391,035 | 2/1995 | Krueger . |
| 5,538,390 | 7/1996 | Salzman . |
| 5,674,039 | 10/1997 | Walker et al. ....................... 414/411 X |
| 5,795,355 | 8/1998 | Moran . |
| 5,909,994 | 6/1999 | Blum et al. .............................. 414/217 |
| 5,915,562 | 6/1999 | Nyseth et al. ....................... 414/217 X |
| 5,975,825 | 11/1999 | Blattner et al. ...................... 414/411 X |
| 5,984,610 | 11/1999 | Rush et al. ........................... 414/411 X |

Primary Examiner—Dean J. Kramer
Assistant Examiner—Gerald J. O'Connor
Attorney, Agent, or Firm—Knobbe, Martens, Olson & Bear, LLP

[57] ABSTRACT

Two FOUPs are stacked and moved together towards an equipment wall by a horizontal actuator. FOUP doors are withdrawn as a unit by a horizontal actuator, and lowered as a unit by a vertical actuator to provide access to the interior of the FOUPs.

7 Claims, 3 Drawing Sheets

MULTI-STAGE SINGLE-DRIVE FOUP DOOR SYSTEM

FIELD OF THE INVENTION

This invention relates to semiconductor wafer handling equipment, more specifically, to a system for moving doors of front-opening unified pods (FOUP).

BACKGROUND OF THE INVENTION

Semiconductor wafers or other such substrates are typically subjected to many processing steps that involve moving a cassette of wafers from one type of apparatus to another. For example, wafers that have been subjected to one process in a vapor deposition chamber may have to be moved and cleaned and dried in other apparatus, and then transferred to a different apparatus for additional processing steps. It is very important that the wafers in process be kept isolated from contamination when being transferred. One technique that has been developed is to transfer them in a sealed box or pod. In the new location, it is then necessary to open the box to allow access to the wafers. To minimize contamination and to minimize labor requirements, the box is preferably opened robotically. A FOUP which is one such box has a front-opening door that can be removed by robotic equipment after the door frame has been sealed to mating equipment.

The cost of processing semiconductor wafers, always a prime consideration, is often evaluated by the throughput per unit of cost. Another measure is the throughput per area of floor space, which means that it is desirable to reduce the footprint of the apparatus employed. Related to both is the importance of reducing the capital cost of equipment. Inventions that can improve the competitive edge by either measure are highly desirable.

SUMMARY OF THE INVENTION

Briefly stated, the invention comprises apparatus for simultaneously connecting two FOUPs to substrate handling equipment. This includes a lower platform for supporting one pod and an upper platform for supporting a second pod. The platforms are connected to be moved together towards and away from substrate handing equipment. When so positioned, a door opener interface is positioned to mate or interface with a front door of each of the pods. These interfaces are interconnected so that they will move in unison. Actuators located below the lower platform are provided for moving the pods and the interfaces. Positioning the actuators below the lower platform minimizes the risks of particles reaching the substrates located in the pods.

In accordance with the method of the invention, a FOUP is placed on each of the two platforms with coupling pins on the platform connecting to mating hardware on the lower surfaces of the pods. This positions the pods with their front doors aligned with openings in the apparatus to receive the wafers and aligned with a door opening interface for each of the pods. One or more actuators simultaneously move the pods forwardly to lock into engagement with the door opening interfaces, in accordance with industry standards. The door interface connects with the FOUP door and actuates the mechanism which unlocks the door from the FOUP. Also, the pod frame around the front doors seals with the apparatus wall so that the interior of each pod is exposed to the desired condition within the apparatus when its door is removed. In the next step, the door interfaces are moved simultaneously in a horizontal direction to withdraw the doors from the pods. A vertical drive mechanism is then actuated to lower the doors simultaneously so that the interior of both pods is open to the apparatus for processing the substrate contained in the pod. The steps, of course, are reversed to return the pod front doors to the closed position in the pods, and to retract the pods.

DETAILED DESCRIPTION OF THE PREFERRED EMBODIMENTS

Figure 1:
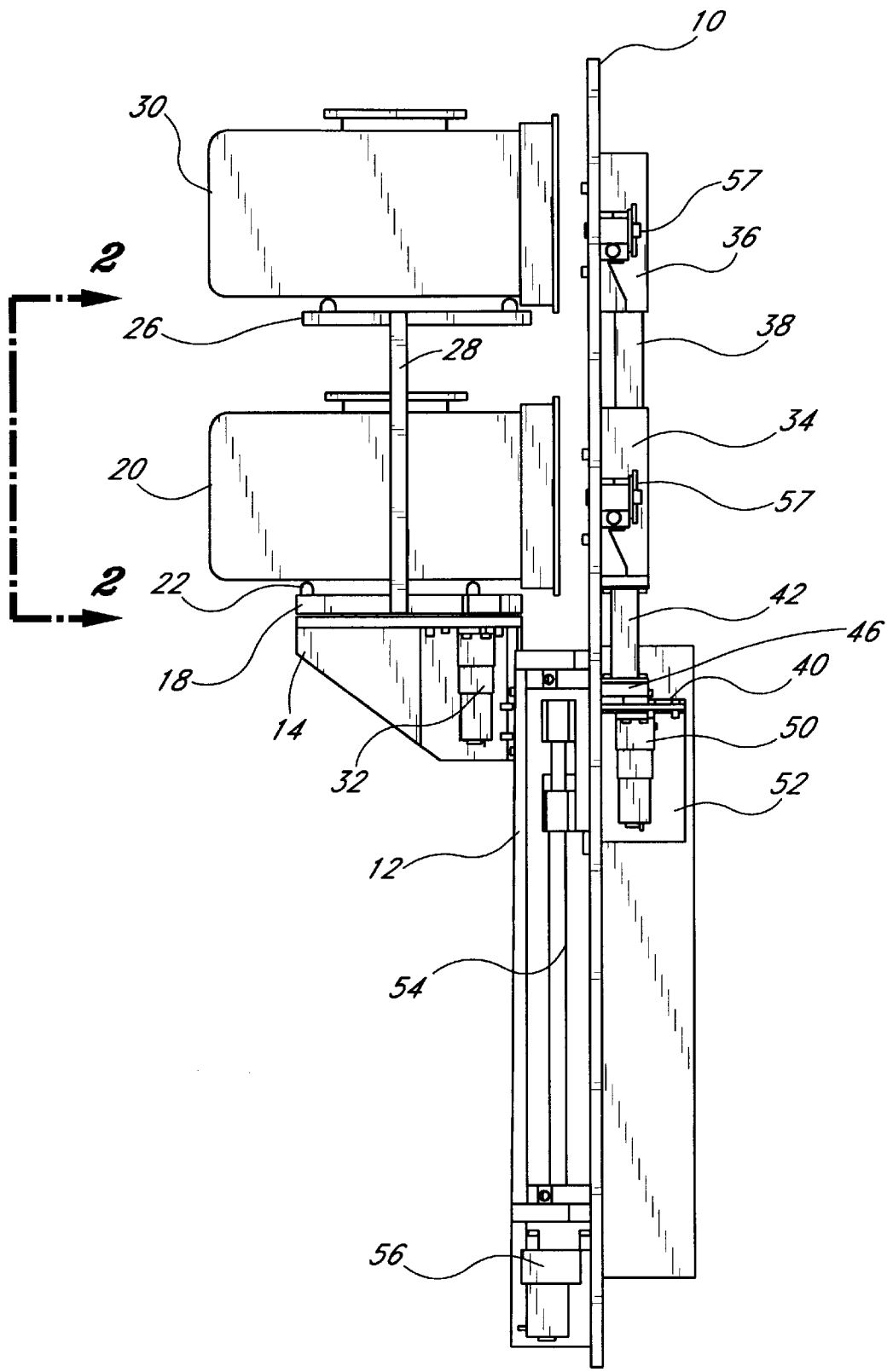
FIG. 1 is a side elevational, somewhat schematic view of apparatus incorporating the invention.

Referring to FIG. 1 a vertical wall 10 represents a wall or clean room interface of typical semiconductor processing apparatus. To the right of the wall represents the interior of the apparatus or processing tool and to the left of the wall represents the exterior clean room. The remainder of the components illustrated in FIG. 1 are supported by this vertical wall. These can be resting on the floor but can be attached to the wall.

Supported on the exterior side is a vertically oriented housing 12. Attached to it is a support 14 which supports a lower registration plate or platform 18. The platform and the supporting structures, is sometimes referred to as a load port, in that it represents the entry to an opening in the wall 10 leading to the interior of the processing apparatus. Extending upwardly from the platform 18 are alignment pins 22 adapted to mate with corresponding openings in the lower portion of the bottom wall of the pod 20. The pod is actually shown spaced slightly above the pins for illustration purposes, but in use, the pins extend into the mating openings in the bottom wall of the pod. The construction of the pod itself is established by Semiconductor Equipment Materials International (SEMI) standards. SEMI standard E 62-0997 is a provisional specification for 300-mm Front Opening Interface Mechanical Standards (FIMS). Details of the interconnection between the pod and the support platform may be obtained from that document, which is incorporated herein by reference.

Figure 2:
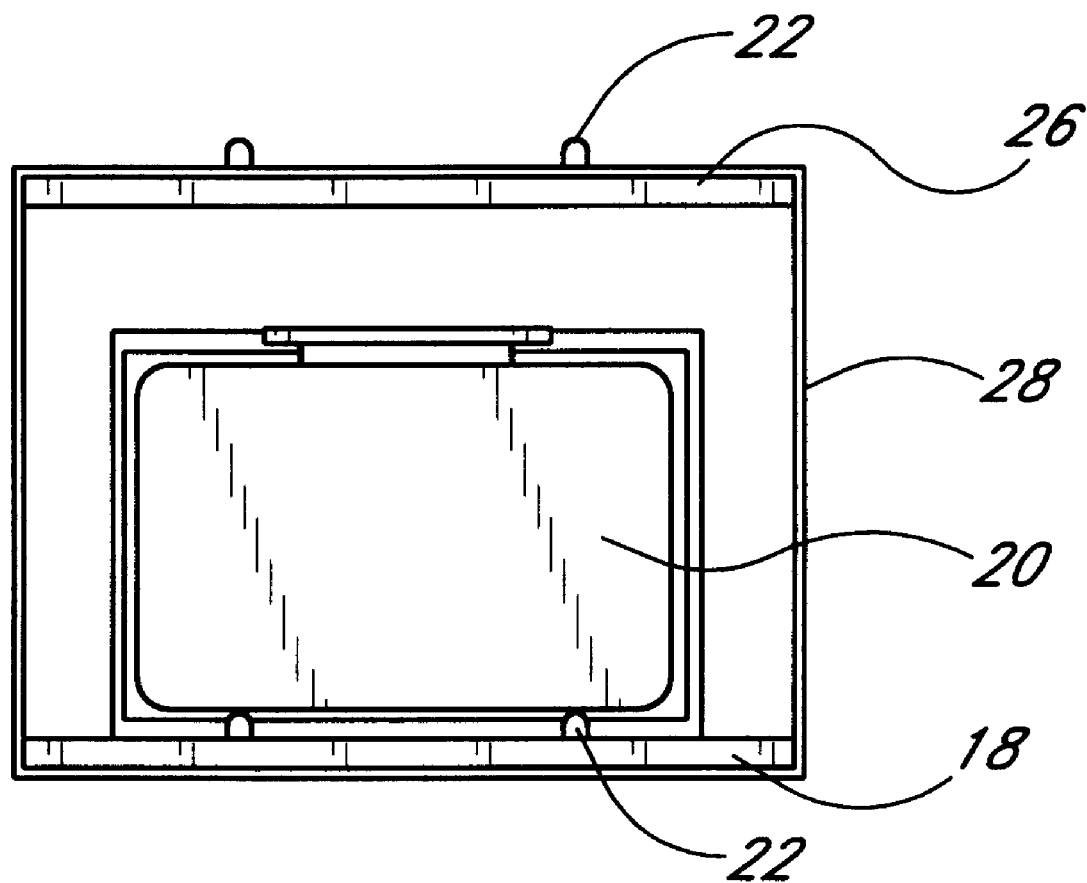
FIG. 2 is a schematic view on line 2—2 of FIG. 1 illustrating the support for the upper FOUP platform.
Figure 3:
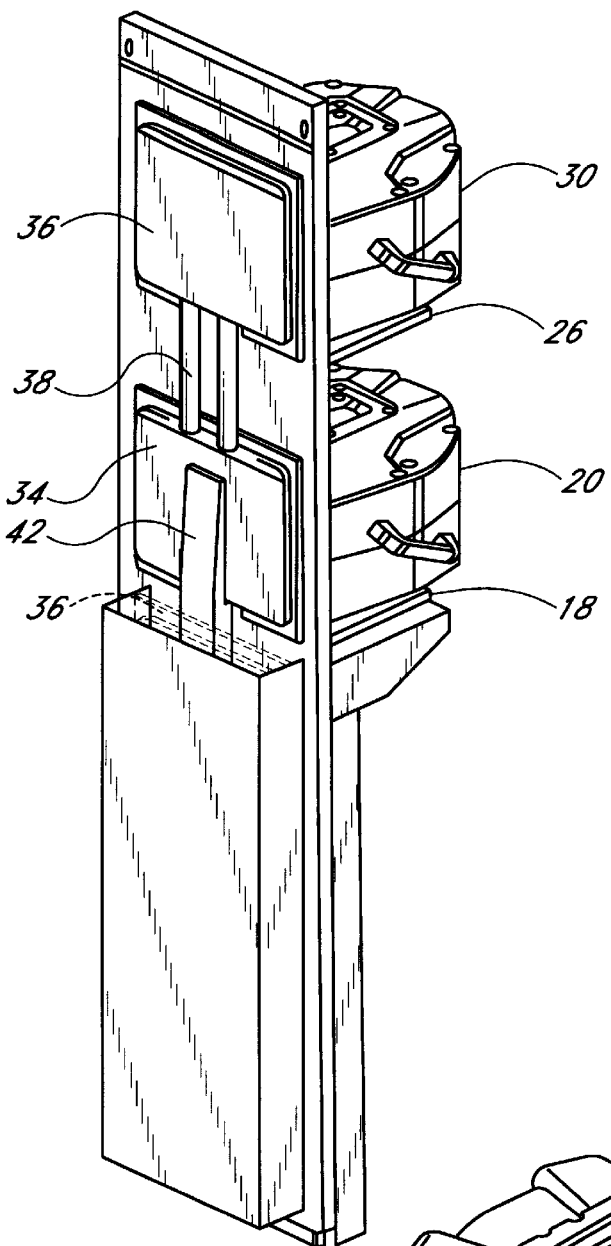
FIG. 3 is a schematic perspective view of the door opening mechanism of FIG. 1 as viewed from the interior of the substrate processing apparatus.
Figure 4:
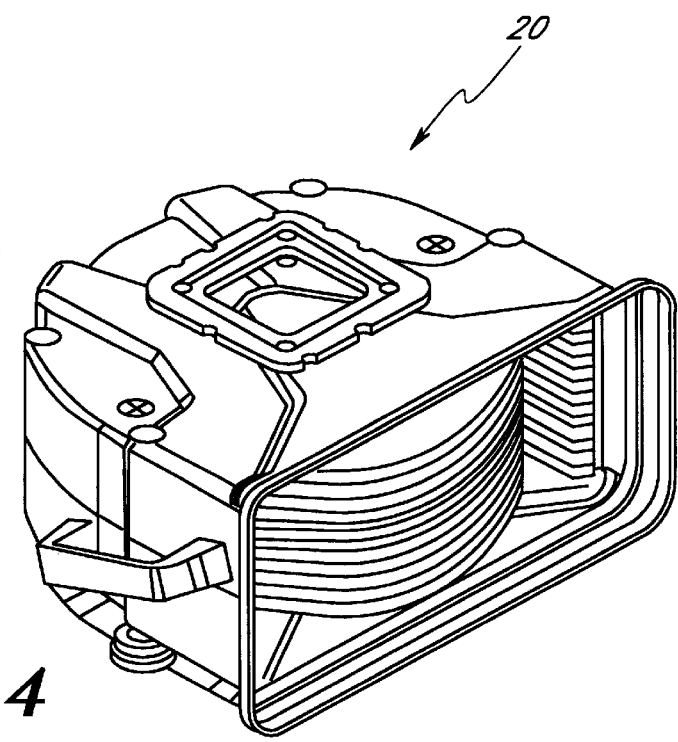
FIG. 4 is a front perspective view of a typical front opening unified pod.

An upper support platform 26 is schematically shown in FIGS. 1 and 2 attached to the lower platform 18 by a frame 28 so that they move together as a unit. Other suitable connecting structures may be employed. A second front opening unified pod 30 is supported on that support platform and mated to pins 22. That pod is also aligned with an opening in the wall 10.

A suitable actuator motor 32 mounted on the support 14 is connected in suitable fashion to move the platforms 18 and 26 horizontally towards and away from the wall 10. Alternatively, the support 28 may be provided with a separate drive (not shown) for moving the platform 26 horizontally towards and away from the opening in the wall 10, but that is less advantageous because of the need for an additional mount for the platform 26 and another drive.

Positioned on the tool side of the wall 10 are a lower door opener 34 and an upper door opener 36 each of which is aligned with an opening in the wall 10 so as to be respectively aligned with the front doors of the pods 20 and 30. Each door opener includes a schematically indicated actuator 57 that can be operated to turn the latch keys securing the doors. The openers are interconnected by struts 38 so the two door openers move as a unit. Preferably, the struts are tubular so that electrical or pneumatic controls may extend through them. The door openers include an interface or a portion that is adapted, in accordance with SEMI standards, to connect with the front wall of the door on the pods. The door openers are mounted on a support bracket 46 that is connected by support 42 to the lower door opener 34, as may be seen in FIG. 1. The support is mounted on the bracket in a manner to permit the door openers to be moved horizontally by a motor or other means 50 towards and away from the wall 10.

The support for the door openers is mounted to a carrier 52 that extends through a vertically oriented slot in the wall 10. The carrier is mounted on a vertical shaft 54 to be moved, together with the door openers, in a vertical direction by an actuator 56.

Operation

In operation, the two pods 20 and 30 are mounted on the lower and upper platforms respectively, with the platforms in a retracted position with respect to the wall 10. The door openers are positioned as shown in FIG. 1, filling the openings in the wall 10 that are aligned with the front door of each of the pods. The horizontal actuator for moving the platforms 18 and 26 is then actuated to move both pods simultaneously towards the wall 10, causing the pod doors to mate with the interface portions of the door openers, while the door frames mate with the portions of the wall 10 defining the openings. The door opener interfaces are automatically coupled to the pod doors in accordance with SEMI standards utilizing the actuator 57. The horizontal actuator for the door openers is then activated causing the pod doors to be retracted or moved inwardly into the tool side of the wall 10. The interiors of the pods are then open to the interior of the tool side of the wall.

The vertical actuator 56 for the door openers is then actuated causing both doors to be simultaneously moved vertically out of alignment with the pods. That is, both door openers are moved to a position below the opening to the lower pod so the interiors of both pods are accessible from the tool side of the wall 10. The substrates within the pod can then be removed from the pods for processing within the tool, and ultimately returned to the pods.

The procedure is then reversed to once more restore the pod doors. That is, the vertical actuator is actuated to move the door openers vertically so that they are once more horizontally aligned with the pods. The horizontal door opener actuator is then energized to move the door openers towards the pods to position the doors within the pods and releasing them. The door openers can then moved horizontally away from the pods, leaving the doors once more restored to the pods. The pods can then be withdrawn from the wall by energizing the horizontal actuators that withdraw the support panels 18 and 28 from the wall. The pods may then be moved to a new desired location.

It will be recognized that a major advantage of the arrangement described is that particles that might be caused by the various actuators are all below the level of the lower pod 20. Thus, when the pod doors are removed and lowered, the likelihood of particles entering the pod is greatly minimized from that which might exist if the actuators were above the pods. Additionally, only a single horizontal actuator is required for moving both pods horizontally, only a single actuator is required for moving both door openers horizontally, and only a single vertical actuator is required for moving both door openers vertically. This then saves on equipment costs, versus having two side-by-side single arrangements, and increases throughput per unit cost. Also, the arrangement saves floor space by having the pods vertically stacked rather than have them positioned in a side-by-side relation, thus increasing throughput per area floor space.

What is claimed is:

1. Apparatus for connecting front opening unified pods to substrate handling equipment, said apparatus comprising:

a lower pod support platform;

an upper pod support platform spaced above the lower platform a distance to permit the placement of a pod on the lower platform;

a lower pod door opener interface configured to interface with a front door of said the pod in the lower platform;

an upper door opener interface configured to interface with a front door of a pod on the upper platform, said upper and lower interfaces being interconnected so that movement of the lower interface will move the upper interface;

a horizontal actuator located below said lower platform for moving said pods and said door opening interfaces horizontally to remove front doors from said pods; and a vertical actuator located below said lower platform for lowering both of said door opening interfaces at the same time together with said pod doors carried by said interfaces to permit access to substrates within the interior of said pods.

2. The apparatus of claim 1, including platform actuator for moving said platforms horizontally.

3. The apparatus of claim 2 including a support connecting said platform so that they are moved together as a unit by said platform actuator.

4. A method of connecting and opening front opening unified pods to equipment for moving substrates into and out of the pods, said method comprising the steps of:

positioning one of said pods on a lower platform mounted on said equipment;

positioning a second one of said pods on an upper platform spaced above said lower platform;

positioning a lower pod door opening interface in front of a front door of said lower pod and positioning an upper pod door opening interface in front of the front door of said upper pod, said door opening interfaces being connected to move as a unit;

producing relative horizontal movement between said door interfaces and said pods to cause the door interfaces to be connected to said doors;

producing relative movement between said pods and said door opening interfaces to simultaneously withdraw said doors from said upper and lower pods produced by an actuator positioned beneath said lower pod so that particles produced by the actuator are remote from the opened pods; and lowering said door opening interfaces unit and said pod doors to a position wherein the interiors of said pods are accessible for the removal of substrates within said pods.

5. The method of claim 4, wherein said movement to withdraw said doors is produced by an actuator positioned beneath said lower pod so that particles produced by the actuator are remote from the opened pods, and wherein said moving step includes lowering said door opening unit, and the lowering step is performed by an actuator lower than said lower pod so as to minimize the risk of particle contamination of said substrates by said door lowering actuator.

6. The method of claim 4, including the step of moving said pods horizontally to cause the pod front doors to be aligned with openings in a vertical wall and to cause a frame around the doors to engage the wall surrounding the opening.

7. The method of claim 6, including returning the pods to said platforms by including the steps of raising said unit into alignment with said pods, moving the doors horizontally into engagement with the pods, and moving the pods with the doors away from the wall.

* * * * *